United States Patent [19]

Buzzell

[11] 4,356,253
[45] Oct. 26, 1982

[54] PHOTOIMAGING PROCESS FOR FORMING MULTICOLOR IMAGES
[75] Inventor: John G. Buzzell, Towanda, Pa.
[73] Assignee: E. I. Du Pont de Nemours and Company, Wilmington, Del.
[21] Appl. No.: 215,699
[22] Filed: Dec. 12, 1980
[51] Int. Cl.$^3$ .............................................. G03C 1/90
[52] U.S. Cl. .................................... 430/291; 430/256; 430/263; 430/293; 430/262
[58] Field of Search ............... 430/291, 260, 256, 259, 430/257, 293, 263, 262

[56] References Cited
U.S. PATENT DOCUMENTS 3,113,208  12/1963  Traver ................................. 250/324
3,220,842  11/1965  Carroll et al. ...................... 430/256
3,649,268  3/1972   Chu et al. ........................... 430/291

Primary Examiner—Won H. Louie, Jr.

[57] ABSTRACT

Improved process for forming multicolor proofs by laminating to a receptor a positive-working photopolymer element having an electrical discharge treated polyethylene terephthalate support bearing a photopolymerizable layer containing a monomeric component of or mixture of monomeric components as defined; a compatible polymeric acrylate binder and optionally a polyvinyl acetate binder, the weight ratio of polyvinyl acetate to acrylate binder being less than 4 to 3, and an initiator or initiator system; exposing the layer imagewise; removing the support, applying and distributing colorant, removing the colorant in the exposed areas and repeating the steps at least once with another photopolymer element, the lamination being to the previously laminated element.

9 Claims, No Drawings

PHOTOIMAGING PROCESS FOR FORMING MULTICOLOR IMAGES

TECHNICAL FIELD

This invention relates to a process for preparing a multicolor image. More particularly this invention relates to a process for preparing multicolor images using improved photopolymerizable elements.

BACKGROUND ART

Reproduction processes are known wherein positive-working photopolymerizable elements are exposed imagewise through an original forming tacky and nontacky areas. Chu and Cohen U.S. Pat. No. 3,649,268 describes such a process using positive-working photopolymerizable elements. The image is developed by toning with a suitable toner which desirably adheres only in the tacky image areas. Excess toner which may be present is removed from the nontacky areas to provide, for example, an image which is a proof of the original or which can be used to transfer the image to another surface. Multicolored proofs can be made as well.

The positive-working photopolymerizable elements, as described above, provide good quality proofs. Nevertheless, it is desirable that proofs with improved image quality be obtained. One problem with the positive-working photopolymerizable elements which effects image quality is "pick-off" of the toner in the toned image areas. Pick-off is defined as low adhesion of a toner to tacky areas such that when a photopolymerizable element is applied over the toned image it does not adhere well to the previously toned image area [so that when the cover sheet (support) of the element is removed areas of the layer above the toned area come off with the cover sheet, taking with it some of the applied toner]. Another problem which effects image quality of proofs is incomplete cleanup of the nontacky or nonimage areas. After cleanup of the nontacky areas a small amount of toner is found to remain in these areas. Still another problem is staining or undesirable color in the nontacky areas. Stain has been found to be caused by the retention of very minute particles of toner in the exposed, hardened nontacky areas.

The reasons why the aforementioned problems occur during the preparation of multicolor proofs using positive-working photopolymerizable elements are not fully understood. It is believed, however, that static electricity generated during distribution of the colorant or toner over the tacky image surface and during the removal of the colorant or toner from the nontacky areas is one important factor affecting image quality. Since the distribution and cleanup operations are necessary in the preparation of multicolor proofs, there had to be devised means to prevent the buildup of static charges on the image surface or to neutralize the static charge buildup.

It has been found surprisingly that by electrical discharge treating the polyethylene terephthalate supports of the photopolymerizable elements used for the preparation of proofs the above disadvantages have been overcome or substantially reduced. The peel force required to remove the support from the underexposed areas has been found to be reduced to about one third of the value achieved when the polyethylene terephthalate support is not treated. Reduced upper image layer pick-off on removal of the support is thereby achieved. In addition, residual toner retention in nontacky areas is reduced and ease of cleanup by hand and automatic machine operations is improved. The propensity to stain in the nontacky areas is also decreased.

DISCLOSURE OF THE INVENTION

In accordance with this invention there is provided in a process for forming a multicolor image by photopolymerizing comprising:

1. laminating to a receptor surface a photopolymerizable element comprising a support that transmits actinic radiation and a photopolymerizable layer so as to form a laminated structure having the photopolymerizable layer contiguous to the receptor surface, the receptor surface having greater adhesion to the photopolymerizable layer in both its polymerized and unpolymerized states than does the support;

2. exposing the layer imagewise through the support to actinic radiation to selectively raise the stick temperature of those areas receiving the radiation;

3. removing the support without transfer thereto of either exposed or underexposed areas of the photopolymerizable layer;

4. applying colorant material to the surface of the layer;

5. distributing the colorant material over the image surface whereby the distributed colorant material becomes embedded solely in the underexposed areas;

6. physically removing colorant material from the exposed image areas which are left substantially free of the colorant material; and 7. repeating said steps of laminating, exposing, removing, applying, distributing and removing one or more times, each succeeding photopolymerizable element having its photopolymerizable layer contiguous to the exposed and colored surface of the last previously laminated photopolymerizable layer; the improvement wherein the photopolymerizable element comprises a polyethylene terephthalate support which is surface treated by electrical discharge at the rate of 1.0 to 6.0 joules/inch$^2$, the treated surface bearing the photopolymerizable layer which comprises a free radical initiated, chain propagating, addition polymerizable compound taken from the group consisting of trimethylolpropanetrimethacrylate, polyoxyethylatedtrimethylolpropanetriacrylate, and a mixture of polyoxyethylatedtrimethylolpropanetriacrylate and one of the addition polymerizable compounds taken from the group consisting of trimethylolpropanetrimethacrylate, trimethylolpropanetriacrylate, pentaerythritoltriacrylate, tetraethyleneglycoldiacrylate and tetraethyleneglycoldimethacrylate, at least one compatible organic polymeric acrylate ester binder and optionally a polyvinyl acetate binder which may be present in a weight ratio of less than 4 to 3 with respect to the acrylate ester binder component, and an addition polymerization initiator or initiator system activatable by actinic radiation.

The photopolymerizable element used in the above-described process comprises a layer of photopolymerizable material on a polyethylene terephthalate base support which is surface treated by electrical discharge at the rate of 1.0 to 6.0 joules/inch$^2$ (15.5 to 93.0 joules/dm$^2$). The electrical discharge treatment can be accomplished by treating a moving web of polyethylene terephthalate film, 0.0005 inch (0.0013 cm) to 0.007 inch (0.018 cm) thick, as it passes the treatment apparatus at a lineal web speed of about 30 to 650 feet/minute.

A useful electrical treatment apparatus is manufactured by Electronic Navigation Industries, Inc., 3000 Winton Rd., South, Rochester, N.Y. The following formula is applicable in calculating the energy/unit (E/A) applied by the electrical discharge treatment:

$$P = (E/A) \times S \times L$$

wherein
P is the power (watts)
(E/A) is the energy per unit area (joules/inch$^2$)
S is line speed (inches/second)
L is the electrode width (placed transverse to web travel)

The treatment, while generally accomplished on a moving web of film, can be accomplished by treating separate pre-cut polyethylene terephthalate film supports. In this event, $P = (E/A) \times (A/T)$ wherein P, E/A are described above, A is the area and T is the time (seconds).

The photopolymerizable element may also have a removable protective cover sheet on the photopolymerizable layer, the cover sheet being less strongly adherent at room temperature to the photopolymerizable layer than is the base support. The cover sheet is removed from the photopolymerizable element prior to lamination of the layer or the element to the receptor. Polypropylene is a preferred cover sheet. Other films such as polyethylene are useful as cover sheets.

The term "photopolymerizable" as used herein refers to systems in which the molecular weight of at least one component of the photosensitive layer is increased by exposure to actinic radiation sufficiently to result in a change in the rheological and thermal behavior of the exposed areas. The term "underexposed" as used herein is intended to cover the image areas of the photopolymerizable layers which are completely unexposed or those exposed only to the extent that there is polymerizable compound still present in sufficient quantity that the molecular weight remains substantially lower than that of the complementary exposed image areas. The term "stick temperature" as applied to either an underexposed or exposed area of the photopolymer layer means the minimum temperature at which the image area in question sticks or adheres, within 5 seconds, under slight pressure, e.g., thumb pressure, to analytical paper (Schleicher and Schull analytical filter paper No. 595) and remains adhered in a layer of at least detectable thickness after separation of the analytical paper from the stratum.

Elements useful in the process comprise the above-described electrical discharge treated polyethylene terephthalate support bearing a layer, e.g., preferably having a thickness less than about 0.001 inch (0.0025 cm) of a photopolymerizable composition which comprises at least one free radical initiated, chain propagating, addition polymerizable compound taken from the group consisting of trimethylolpropanetrimethacrylate, polyoxyethylatedtrimethylolpropanetriacrylate, and a mixture of polyoxyethylatedtrimethylolpropanetriacrylate and one of the addition polymerizable compounds taken from the group consisting of trimethylolpropanetrimethacrylate, trimethylolpropanetriacrylate, pentaerythritoltriacrylate, tetraethyleneglycoldiacrylate and tetraethyleneglycoldimethacrylate, at least one compatible organic polymeric acrylate ester binder and optionally a polyvinyl acetate binder which may be present in a ratio of less than 4 to 3 with respect to the acrylate ester binder component, and an addition polymerization initiator or initiator system activatable by actinic radiation. It is important that the photopolymerizable composition provide sufficient tackiness to the surface so that adequate image density is achieved by toning. The composition should also be homogeneous (compatible) in nature. Mottled background, greasy films and poor adhesion are undesirable properties obtained with photopolymer compositions having poor compatibility. Preferably both monomeric compounds are present in the photopolymerizable composition together with an acrylate ester binder, e.g., polymethylmethacrylate and polyvinyl acetate binders. The ratio of monomer to binder is from 60 to 40 to 33 to 67 percent by weight, preferably 50 to 50 percent by weight, the weight percent being based on the total weight of monomer and binder in the composition. The polyvinyl acetate binder when present in the photopolymerizable composition must be present in a weight ratio of less than 4 to 3 with respect to the acrylate ester binder component.

A free radical generating addition polymerization initiator or initiator system activatable by actinic radiation is present in the photopolymerizable composition in an amount of about 0.01 to 10 percent by weight based on the weight of solids in the composition. A preferred photoinitiator is a hexaarylbiimidazole compound of the type described in Chambers U.S. Pat. No. 3,479,185, incorporated by reference. A preferred hexaarylbiimidazole compound is 2-o-chlorophenyl-4,5-bis-(m-methoxyphenyl)imidazolyl dimer. Other useful photoinitiators are disclosed in U.S. Pat. No. 3,060,023, incorporated by reference.

Other components in addition to those described above can be present in the photopolymerizable compositions in varying amount. Such components include: optical brighteners, ultraviolet radiation absorbing material, plasticizers, thermal stabilizers, hydrogen donors, etc.

Optical brighteners useful in the process of the invention include: preferably optical brighteners designated 1 and 2 below in the Example as well as the other optical brighteners disclosed in Held U.S. Pat. No. 3,854,950, incorporated by reference. At least 0.5% by weight of optical brighteners are present based on the weight of solids in the composition. Ultraviolet radiation absorbing materials useful in the invention are also disclosed in Held U.S. Pat. No. 3,854,950, columns 3 and 4, incorporated by reference. 2,2'-Dihydroxy-4-methoxybenzophenone is a preferred ultraviolet radiation absorbing material.

Where the photopolymerizable composition is a relatively hard, high melting compound a plasticizer is usually used to lower the glass transition temperature and facilitate selective stripping. The plasticizer may be the monomeric component itself, e.g., acrylate ester, or one of the common plasticizers which are compatible with the polymeric binder. Among the common plasticizers are dialkyl phthalates, polyethylene glycol, alkyl phosphates and polyoxyethylene alkyl ethers, e.g., polyoxyethylene (4) lauryl ether. Additional plasticizer can be present in an amount up to 10% by weight based on the weight of solids in the composition.

Useful thermal stabilizers include: hydroquinone, phenidone, hydroquinone monomethyl ether, p-methoxyphenol, alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene, dinitrobenzene, p-toluqinone and chloranil. The dinitroso dimers described in Pazos U.S. Pat. No. 4,168,982, incorporated by reference, are also useful.

Hydrogen donor compounds useful in the photopolymer compositions include: 2-mercaptobenzoxazole, 2-mercaptobenzothiazole, etc.; as well as various types of compounds, e.g., (a) ethers, (b) esters, (c) alcohols, (d) compounds containing allylic or benzylic hydrogen cumene, (e) acetals, (f) aldehydes, and (g) amides as disclosed in column 12, lines 18 to 58 of MacLachlan U.S. Pat. No. 3,390,996, incorporated by reference.

It has been found that while omission of any of the above-described additional components does not materially affect the improvement in pick-off, stain, etc. achieved by the invention other disadvantages may occur due to their absence. For example, the speed of the photopolymer composition as well as halation problems can develop in the absence of the optical brighteners. Halation may also be a problem if the ultraviolet radiation absorbing material and thermal stabilizer are not present.

The photopolymerizable layer thickness can vary according to the composition and the material used as receptor. The number of layers of photopolymer in the laminated final product is dependent upon the image being reproduced, the desired quality of the final product and uses made of the final product.

The above-described photopolymerizable elements are useful in the imaging process described in Chu et al. U.S. Pat. No. 3,649,268. After removal of the cover sheet, the supported photopolymerizable layer is laminated to a receptor surface. The receptor is a material that adheres strongly to the photopolymer layer. Almost any material, e.g., paper, polymer film, plastic, metal, ceramic, glass, etc. makes a suitable receptor. The only prerequisites for a receptor are that the anchorage between the receptor and the photopolymer layer be greater than that between the coating and the support, and that the receptor be stable at the operating temperatures.

After lamination the exposure of the photopolymerizable element may be through line or halftone positive transparencies. The transparency and the element generally are in operative contact during the exposure which may be made through either side in the case of an element that has transparent support and receptor. Preferably the element is exposed through the polyethylene terephthalate support side.

Since most of the photopolymerizable materials preferred in this invention exhibit their maximum sensitivity in the ultraviolet range, the light source should furnish and effective amount of this radiation. Such sources include carbon arcs, mercury-vapor arcs, fluorescent lamps with special ultraviolet-emitting phosphors, argon glow lamps, electronic flash units and photographic flood lamps. The amount of exposure required for satisfactory reproduction of a given element is a function of exposure time, type of light source used, and distance between light source and element.

Each photopolymerizable element present in the multicolor proof, after imagewise exposure and removal of the support, is toned by applying colorant material. The various colorants are applied generally at room temperature but elevated temperatures can be used if required. Suitable toners are described in U.S. Pat. Nos. 3,649,268, 3,620,726, 3,909,282 and 4,215,193, all incorporated by reference. The toners may be applied by a dusting treatment similar to that disclosed in U.S. Pat. No. 3,060,024 or applied and distributed by means of a toner applicator as described in U.S. Pat. No. 4,087,279, incorporated by reference. The excess toner present in the exposed areas of the photopolymer element is removed physically by soft materials of various types, e.g., silicone-treated cloth, absorbent cotton, acrylic pile, etc.

It is necessary in order to form multicolor proofs to repeat the steps of laminating, exposing, removing, applying, distributing and removing colorant material one or more times depending on the type of proof that is desired. The optical density values achieved with the individual layers and the composite can be readily determined by known densitometers, e.g., digital reflection densitometer, MacBeth Model RD514, MacBeth Division of Kollmorgen Corp., Newburgh, N.Y.

THE BEST MODE FOR CARRYING OUT THE INVENTION

The best mode for carrying out the process of this invention is illustrated in the Example wherein a mixture of trimethylolpropanetrimethacrylate and polyoxyethylatedtrimethylolpropanetriacrylate is present.

INDUSTRIAL APPLICABILITY

The process of this invention provides a quick method for preparing multicolor proofs of improved quality from positive-working composite photopolymerizable elements. The multilayer proofs can have a glossy finish or a matte finish. The proofs can contain from two to four differently colored images. Each photopolymer layer is exposed through a different color transparency and the respective layer is colored with colorant material in the spectral region corresponding to the color separation transparency used for exposure. Generally the colored elements and separation transparencies correspond, respectively, to yellow, magenta, cyan and black. The multicolor proofs exhibit reduced propensity for "pick-off" of toner in toned image areas and for stain in the exposed, hardened nontacky areas, and improved cleanup of the nontacky areas. These advantages are more readily noted in a composite element, particularly one possessing yellow, magenta, cyan and black photoimaged layers.

The following example illustrates the invention wherein the percentages are by weight.

EXAMPLE

A photopolymerizable composition is prepared by mixing together the following ingredients:

| Ingredient | Amount (g) |
| --- | --- |
| 1. Polymethylmethacrylate, $\overline{Mw}$, 629,000; $\overline{Mn}$, 129,000; P.D.I., 4.86[1] | 25.0 |
| 2. Polyvinyl acetate, $\overline{Mw}$, 120,000; $\overline{Mn}$ 512; P.D.I., 234[2] | 10.0 |
| 3. Trimethylolpropanetrimethacrylate | 28.0 |
| 4. Polyoxyethylatedtrimethylolpropane-triacrylate, molecular weight ~ 1162 | 6.0 |
| 5. 2-o-Chlorophenyl-4,5-bis-(m-methoxyphenyl) imidazolyl dimer | 1.2 |
| 6. Polyoxyethylene (4) lauryl ether | 6.0 |

-continued

| Ingredient | Amount (g) |
|---|---|
| 7. Hydroquinone | 0.04 |
| 8. 2-Mercaptobenzoxazole | 0.60 |
| 9. Optical brightener[3] | 0.16 |
| 10. Optical brightener[4] | 0.80 |
| 11. 2,2'-Dihydroxy-4-methoxybenzophenone | 0.06 |

[1] Mw is weight average molecular weight, Mn is number average molecular weight, P.D.I. is polydispersity index equals Mw / Mn determined by G.P.C. (gel phase chromatography)
[2] Same meaning as [1] above but determined by S.E.C. (size exclusion chromatography)
[3] 2-(Stilbyl-4")-naphtho-1',2':4,5)-1,2,3 triazole-2"-sulfonic acid phenyl ester
[4] 7-(4'-Chloro-6'-diethylamino-1',3',5'-triazine-4'-yl)amino 3-phenyl coumarin The above mixture is dissolved in methylene chloride (24% solution) and is coated on a 0.0005 inch (0.0013 cm) thick polyethylene terephthalate film support treated by electrical discharge at 1.4 joules/inch$^2$ (21.7 joules/dm$^2$). A 0.00075 inch (0.0019 cm) thick cover sheet of polypropylene is laminated onto the coating at 60° C. The cover sheet is removed at room temperature with substantially no effect on the photopolymer layer, and the layer is laminated at about 110° C. to the smooth side of Kromekote ® cast-coated one-side paper, manufactured by Champion Paper and Fiber Company, using a Cromalin ® Laminator Model 2700 manufactured by E. I. du Pont de Nemours and Company, Wilmington, Del. The photopolymer element is exposed to a halftone negative minus-blue, color separation film record, the exposure being made through the electrical discharge treated, clear polyethylene terephthalate film. The exposure is for 15 seconds on an exposing device identified as a Berkey-Ascor Vacuum Printer, fitted with a photopolymer lamp (5 KW) and a Kokomo ® glass filter (No. 400), Kokomo Opalescent Glass Co., Kokomo, Ind. After the exposure the exposed element is taped securely to a suitable flat surface, and the polyethylene terephthalate film is stripped by pulling at one corner with an even, continuous motion at an angle of about 100° to 150°. Yellow toner described in Example 9 of U.S. Pat. No. 4,215,193 is applied to the image-bearing surface using the toner applicator described in Sandner U.S. Pat. No. 4,019,821 and is distributed over the surface as described in this patent. The yellow-toned image is cleaned with a LAS-TIK ® cloth manufactured by LAS-TIK ® Manufacturing Co., Wayne and B Streets, Hamilton, Ohio.

The polypropylene cover sheet is removed from a second photopolymer element coated with the above-described photopolymerizable composition and the clear photopolymer layer is laminated onto the yellow-toned layer, obtained above, at a temperature of 110° C. The two-layer element is exposed through a minus-green separation halftone positive for 15 seconds using the above-described light source. The electrical discharge treated polyethylene terephthalate film is stripped from the photopolymer layer as described above and magenta toner described in Example 11 of U.S. Pat. No. 4,215,193 is applied and distributed over the image surface as described above. A final cleanup is also accomplished as described above.

The above procedure is repeated two more times using separate photopolymerizable elements. The third element laminated to the magenta-toned layer is exposed through a minus-red halftone positive and a cyan toner described in Example 1 of U.S. Pat. No. 4,215,193 is applied. The fourth element laminated to the cyan-toned layer is exposed through a black printer halftone positive and a black toner described in Example 10 of U.S. Pat. No. 4,215,193 is applied.

After application of the black toner, a fifth photopolymer element is laminated at 110° C. over the four-color halftone positive. The five-layer element is given an overall exposure of 150 seconds in the above-described light source. The polyethylene terephthalate film present on the overall exposed photopolymer layer is removed as described above.

The above procedure is repeated except that the support used is standard polyethylene terephthalate (not electrical discharge treated). The quality of the proof prepared using the electrical discharge treated polyethylene terephthalate support is superior to the control proof with respect to pick-off, stain in the underexposed areas and ease of toner cleanup in the exposed background areas.

The amount of trimethylolpropanetrimethacrylate described above in the Example can be replaced by equal amounts of the following monomers: trimethylolpropanetriacrylate, pentaerythritoltriacrylate, tetraethyleneglycoldiacrylate, and tetraethyleneglycoldimethacrylate. Improved pick-off, stain in the underexposed areas and ease of cleanup in the exposed background areas is achieved.

I claim:
1. In a process for forming a multicolor image by photopolymerizing comprising:
   1. laminating to a receptor surface a photopolymerizable element comprising a support that transmits actinic radiation and a photopolymerizable layer so as to form a laminated structure having the photopolymerizable layer contiguous to the receptor surface, the receptor surface having greater adhesion to the photopolymerizable layer in both its polymerized and unpolymerized states than does the support;
   2. exposing the layer imagewise through the support to actinic radiation to selectively raise the stick temperature of those areas receiving the radiation;
   3. removing the support without transfer thereto of either exposed or underexposed areas of the photopolymerizable layer;
   4. applying colorant material to the surface of the layer;
   5. distributing the colorant material over the image surface whereby the distributed colorant material becomes embedded solely in the underexposed areas;
   6. physically removing colorant material from the exposed image areas which are left substantially free of the colorant material; and
   7. repeating said steps of laminating, exposing, removing, applying, distributing and removing one or more times, each succeeding photopolymerizable element having its photopolymerizable layer contiguous to the exposed and colored surface of the last previously laminated photopolymerizable layer; the improvement wherein the photopolymerizable element comprises a polyethylene terephthalate support which is surface treated by electrical discharge at the rate of 1.0 to 6.0 joules/inch$^2$, the treated surface bearing the photopolymerizable layer which comprises a free radical initiated, chain propagating, addition polymerizable compound taken from the group consisting of trimethylolpropanetrimethacrylate, polyoxyethylatedtrimethylolpropanetriacrylate, and a mix- ture of polyoxyethylatedtrimethylolpropanetriacrylate and one of the addition polymerizable compounds taken from the group consisting of trimethylolpropanetrimethacrylate, trimethylolpropanetriacrylate, pentaerythritoltriacrylate, tetraethyleneglycoldiacrylate and tetraethyleneglycoldimethacrylate, at least one compatible organic polymeric acrylate ester binder and optionally a polyvinyl acetate binder which may be present in a weight ratio of less than 4 to 3 with respect to the acrylate ester binder component, and an addition polymerization initiator or initiator system activatable by actinic radiation.

2. A process according to claim 1 wherein the addition polymerizable compound is trimethylpropanetrimethacrylate.

3. A process according to claim 1 wherein the addition polymerizable compound is polyoxyethylatedtrimethylolpropanetriacrylate.

4. A process according to claim 1 wherein a mixture of addition polymerizable compounds is present in the photopolymerizable layer.

5. A process according to claim 4 wherein the mixture is of trimethylolpropanetrimethacrylate and polyoxyethylatedtrimethylolpropanetriacrylate.

6. A process according to claim 1 wherein the acrylate ester binder is polymethylmethacrylate.

7. A process according to claim 1 wherein each photopolymerizable layer is exposed through a different color separation transparency and the respective layer having been colored with colorant material in a spectral region corresponding to the color separation transparency used for exposure.

8. A process according to claim 7 wherein four photoimaged colored elements are present and the colored elements and separation transparencies correspond, respectively, to yellow, magenta, cyan and black.

9. A process according to claim 1 wherein the final layer is a nonimagewise exposed photopolymerized layer.

* * * * *